United States Patent
Lee et al.

(10) Patent No.: US 7,820,468 B2
(45) Date of Patent: Oct. 26, 2010

(54) STACK TYPE SURFACE ACOUSTIC WAVE PACKAGE, AND METHOD FOR MANUFACTURING THE SAME

(75) Inventors: Seung Hee Lee, Kyungki-Do (KR); Doo Cheol Park, Kyungki-Do (KR); Joo Hun Park, Kyungki-Do (KR); Young Jin Lee, Kyungki-Do (KR); Sang Wook Park, Kyungki-Do (KR); Nam Hyeong Kim, Kyungki-Do (KR)

(73) Assignee: Samsung Electro-Mechanics Co., Ltd., Suwon, Kyungki-do (KR)

( * ) Notice: Subject to any disclaimer, the term of this patent is extended or adjusted under 35 U.S.C. 154(b) by 0 days.

(21) Appl. No.: 12/546,142

(22) Filed: Aug. 24, 2009

(65) Prior Publication Data

US 2010/0047949 A1  Feb. 25, 2010

Related U.S. Application Data

(62) Division of application No. 11/682,583, filed on Mar. 6, 2007, which is a division of application No. 11/217,465, filed on Sep. 2, 2005, now Pat. No. 7,336,017.

(30) Foreign Application Priority Data

May 6, 2005  (KR) .............................. 2005-38093

(51) Int. Cl.
*H01L 21/782* (2006.01)
(52) U.S. Cl. .................. 438/51; 438/108; 438/113; 438/462; 257/E21.599; 257/E21.511
(58) Field of Classification Search ............ 438/511.08, 438/113, 114, 462, FOR. 387; 257/E21.599, 257/E21.511
See application file for complete search history.

(56) References Cited

U.S. PATENT DOCUMENTS 5,030,931 A    7/1991   Brooks et al.

(Continued)

FOREIGN PATENT DOCUMENTS

JP      07-111438       4/1995

(Continued)

OTHER PUBLICATIONS

Korean Intellectual Property Office, Office Action, mailed Aug. 25, 2006.

(Continued)

*Primary Examiner*—George Fourson
(74) *Attorney, Agent, or Firm*—Lowe Hauptman Ham & Berner LLP (57) ABSTRACT

Disclosed herein is a stack type surface acoustic wave package. The surface acoustic wave package comprises a first bare chip having a plurality of electrodes formed thereon, a second bare chip having a plurality of electrodes and via-holes formed thereon, a connecting portion electrically connecting the first bare chip to an upper surface of the second bare chip such that the electrodes of the first bare chip face the electrodes of the second bare chip, and a sealing member provided on the first and second bare chips to form an air-tight space on an operating surface between the first and second bare chips. The surface acoustic wave package can prevent deformation due to thermal impact from the outside during a packaging process, enhancing reliability of the product, minimizing the size of the product, and reducing manufacturing costs by reducing the number of components and material costs.

9 Claims, 6 Drawing Sheets

U.S. PATENT DOCUMENTS

| | | | |
|---|---|---|---|
| 5,699,027 A | 12/1997 | Tsuji et al. | |
| 5,747,857 A | 5/1998 | Eda et al. | |
| 5,818,145 A | 10/1998 | Fukihura | |
| 6,329,739 B1* | 12/2001 | Sawano | 310/313 R |
| 6,339,365 B1 | 1/2002 | Kawase et al. | |
| 6,351,194 B2 | 2/2002 | Takahashi et al. | |
| 6,467,139 B1 | 10/2002 | Tanaka | |
| 6,492,194 B1* | 12/2002 | Bureau et al. | 438/106 |
| 6,628,043 B2* | 9/2003 | Furukawa et al. | 310/313 R |
| 6,649,446 B1 | 11/2003 | Goetz et al. | |
| 6,670,206 B2* | 12/2003 | Kim et al. | 438/26 |
| 6,803,698 B2 | 10/2004 | Tabota | |
| 6,852,561 B2* | 2/2005 | Bidard et al. | 438/50 |
| 6,914,367 B2* | 7/2005 | Furukawa | 310/340 |
| 7,064,452 B2* | 6/2006 | Huang et al. | 257/787 |
| 7,094,626 B2* | 8/2006 | Stelzl et al. | 438/106 |
| 7,154,206 B2* | 12/2006 | Shimada et al. | 310/313 R |
| 7,183,125 B2* | 2/2007 | Anzai et al. | 438/22 |
| 7,183,619 B2* | 2/2007 | Sugiura | 257/416 |
| 7,239,023 B2* | 7/2007 | Yu-Tung et al. | 257/778 |
| 2001/0009342 A1 | 7/2001 | Furukawa et al. | |
| 2004/0104791 A1* | 6/2004 | Satoh et al. | 333/193 |
| 2004/0113215 A1 | 6/2004 | Shimada | |
| 2004/0189146 A1* | 9/2004 | Ueda et al. | 310/313 A |
| 2005/0192727 A1* | 9/2005 | Shostak et al. | 701/37 |
| 2006/0162157 A1* | 7/2006 | Schimetta et al. | 29/846 |
| 2007/0018539 A1* | 1/2007 | Nagashima | 310/348 |
| 2007/0058003 A1 | 3/2007 | Aoki | |
| 2008/0231657 A1 | 9/2008 | Marsh et al. | |

FOREIGN PATENT DOCUMENTS

| | | |
|---|---|---|
| JP | 9181562 | 7/1997 |
| JP | 2001176995 | 6/2001 |

OTHER PUBLICATIONS

USPTO OA mailed Sep. 8, 2009.

* cited by examiner

PRIOR ART

STACK TYPE SURFACE ACOUSTIC WAVE PACKAGE, AND METHOD FOR MANUFACTURING THE SAME

RELATED APPLICATIONS

The present application is a division of U.S. application Ser. No. 11/682,583, filed Mar. 6, 2007, which is a division of U.S. application Ser. No. 11/217,465 which issued as U.S. Pat. No. 7,336,017 on Feb. 26, 2008, which is based on and claims priority from, Korea Application No. 2005-38093, filed May 6, 2005, the disclosures of which are hereby incorporated by reference herein in their entirety.

BACKGROUND OF THE INVENTION

1. Field of the Invention

The present invention relates to a stack type surface acoustic wave package, and a method for manufacturing the same. More particularly, the present invention relates to a stack type surface acoustic wave package, which is formed by packaging two piezoelectric single crystal bare chips formed of the same material to face each other through a chip-scale packaging process and a wafer level packaging process, thereby allowing integration of two filters having different frequency bands and high resistance to thermal impact into a single component while reducing a product size, and a method for manufacturing the same.

2. Description of the Related Art

As communication technology has advanced remarkably in recent years, miniaturization, high performance, and multifunctionality are required for mobile communication products. In order to achieve theses requirements, various components, for example, a filter, a duplexer, and the like, used for the mobile communication products are also required to be miniaturized and multi-functionalized.

Figure 1:
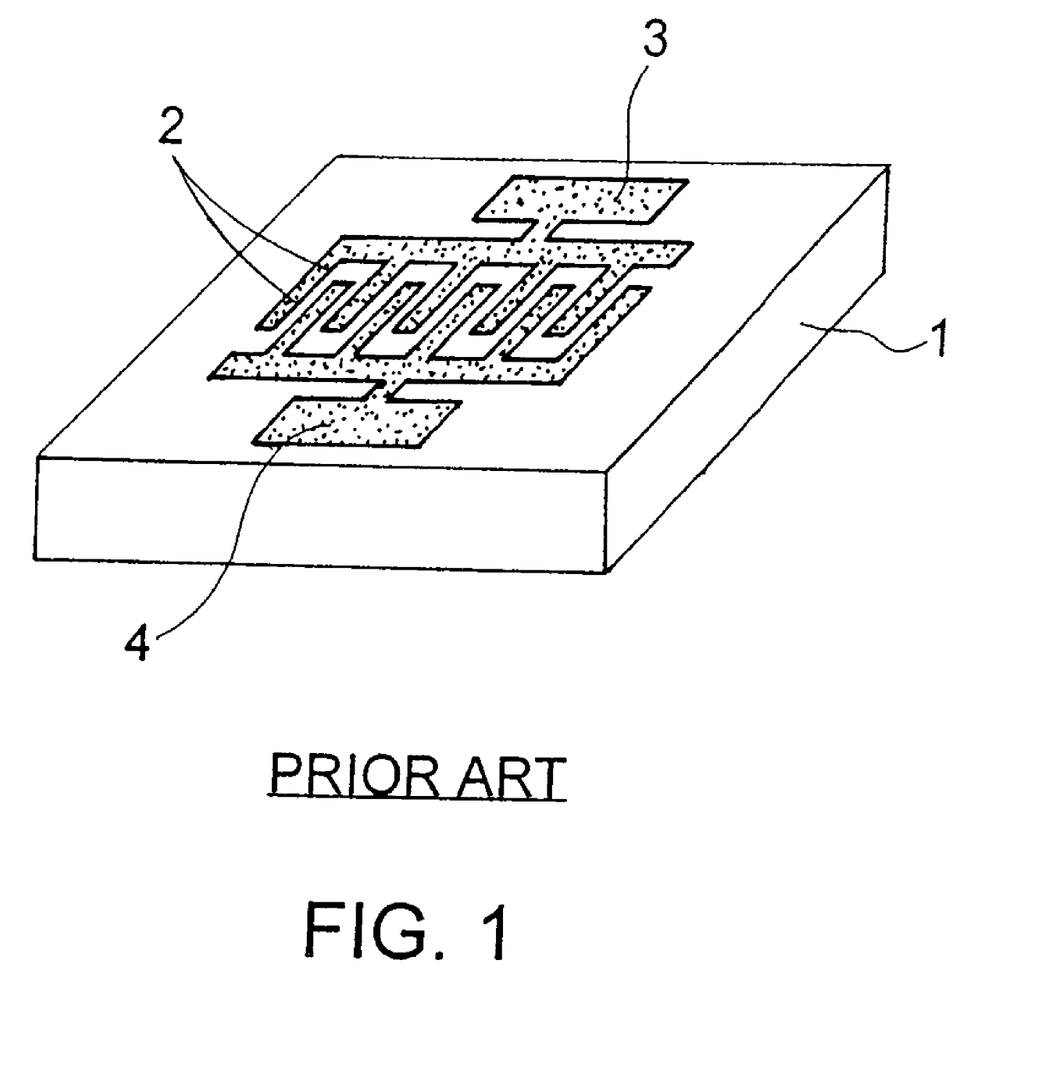
FIG. 1 is a perspective view illustrating a surface acoustic wave device in a conventional surface acoustic wave package.

As for one example of these components, a surface acoustic wave device comprises a piezoelectric board 1 which is a piezoelectric single crystal bare chip, a pair of Inter-Digital Transducer (IDT) electrodes 2 facing each other in an inter-digitated pattern on the piezoelectric board 1, and input and output electrodes 3 and 4 connected to the IDT electrodes 2, respectively.

When an electric signal is applied through the input electrode 3, the piezoelectric effect causes piezoelectric distortion to occur corresponding to an overlap length between the IDT electrodes 2, and the piezoelectric distortion generates surface acoustic waves, which are transmitted to the piezoelectric board 1. Then, the surface acoustic waves are converted into an electric signal, and output through the output electrode 4. At this time, only the electric signal having a predetermined frequency band determined by various factors, such as distance between the IDT electrodes 2, width or length of the IDT electrodes 2, is filtered out.

As such, the surface acoustic wave device has characteristics determined by the distance between the IDT electrodes 2, the width or length of the IDT electrodes 2 formed on the piezoelectric board 1 of the surface acoustic wave device. If the IDT electrodes 2 are damaged or have minute foreign substances such as dust attached thereto, the characteristics of the device will be changed. Thus, various package structures are required to protect the electrodes of the surface acoustic wave device from the external environment.

Figure 2:
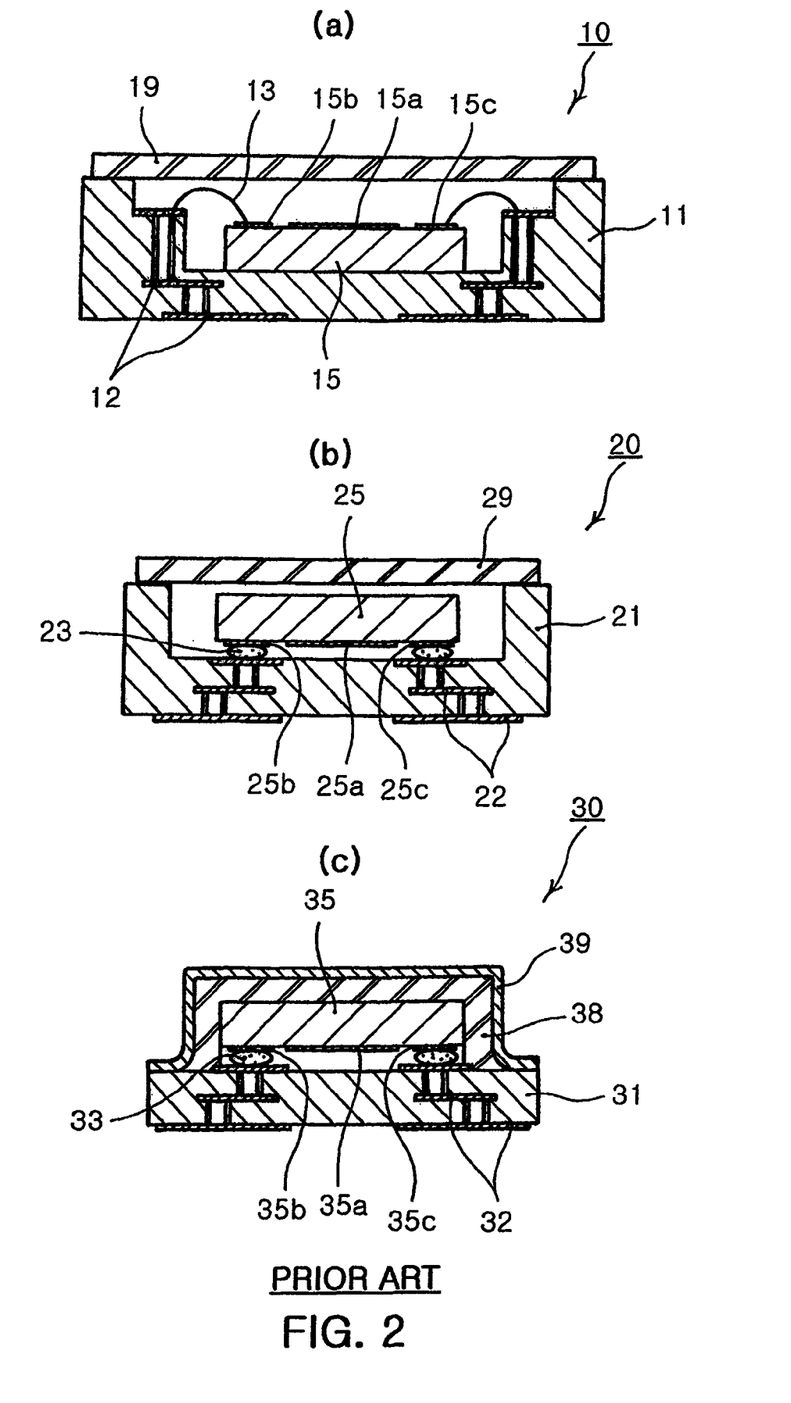
FIG. 2a is a cross-sectional view illustrating a surface-mounting type surface acoustic wave package.
FIG. 2b is a cross-sectional view illustrating a flip-chip type surface acoustic wave package.
FIG. 2c is a cross-sectional view illustrating a chip-scale package type surface acoustic wave package.

A fundamental structure of a conventional surface acoustic wave package comprises a ceramic wiring board, devices mounted on the board, and a sealing member packaging the devices and the board, as shown in FIGS. 2a, 2b and 2c.

In FIG. 2a, a surface-mount type surface acoustic wave package 10 comprises a wiring board 11 formed of a plurality of staked ceramic layers, a device 15 having input, output and IDT electrodes 15a, 15b and 15c formed thereon, and a lid 19 mounted on the wiring board 11 to seal the device 15 in a cavity formed when the plurality of ceramic layers are stacked to form the wiring board 11, in which the device 15 is connected in a wire-bonding manner to via-holes 12 passing through the wiring board 11 via a plurality of metal wires 13 such that the electrodes 15a, 15b and 15c face the lid 19 in the cavity.

In FIG. 2b, a flip-chip bonding type surface acoustic wave package 20 comprises a wiring board 21, a device 25, and a lid 29, in which the device 25 is connected in a flip chip-bonding manner to via-holes 22 passing through the wiring board 21 via a plurality of bump balls 23 such that electrodes 25a, 25b and 25c face the board 21 in a cavity, and in which the device 25 is sealed in the cavity on the wring board 21 by the lid 29.

In FIG. 2c, a chip-scale packaging type surface acoustic wave package 30 comprises a wiring board 31, a device 35, and a metal layer 39, in which the device 35 is connected in a flip chip-bonding manner to via-holes 32 passing through the wiring board 31 via a plurality of bump balls 33 such that electrodes 35a, 35b and 35c face the wiring board 31, and in which the device 35 mounted above the wiring board 31 is sealed by a laminated film 38 and the metal layer 39 applied to an upper surface of the film 38.

The conventional packages 10 and 20 are formed by mounting the devices 15 and 25 on the wiring boards 11 and 21, each of which has the cavity formed by stacking two or more ceramic layers, and then sealing the cavity using the metal lids 19 and 29 welded to the boards 11 and 21. As a result, the conventional packages 10 and 20 are expensive due to material costs, have lots of components and limit reduction in product size, failing to achieve product miniaturization.

Figure 7:
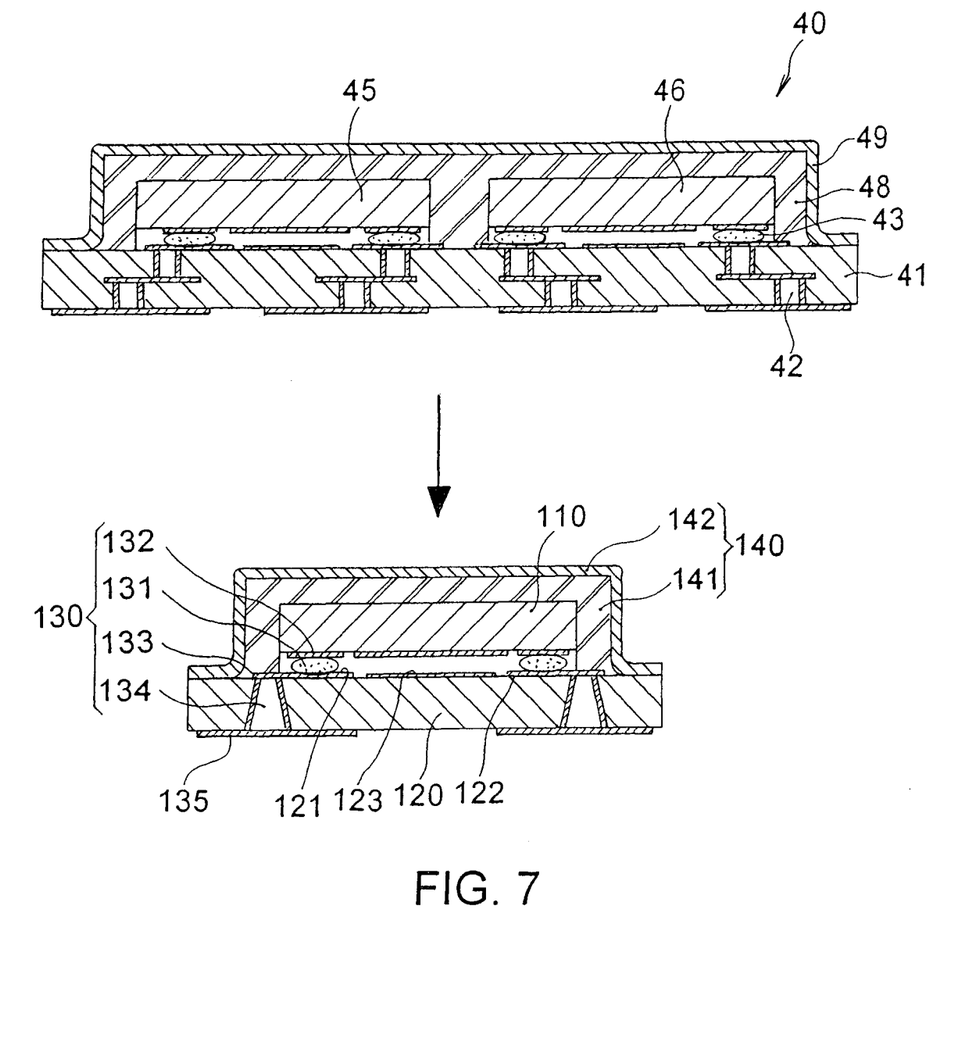
FIG. 7 is a cross-sectional view for comparing the conventional surface acoustic wave package and a surface acoustic wave package in accordance with the present invention.

Meanwhile, in FIG. 7, a surface acoustic wave package 40 can filter out different frequency bands. The surface acoustic wave package 40 is formed by mounting two devices 45 and 46 on a wiring board 51 having via-holes 42 passing therethrough via bump balls 43 in which IDT electrodes of the devices 45 and 46 are different in width, length and distance therebetween, and then sealing the devices using a laminated film 48 and a metal layer 49.

However, since the conventional surface acoustic wave package 40 has the two devices 45 and 46 having different thicknesses, and the two devices 45 and 46 are horizontally disposed on the single wiring board 41, there is a problem in that the overall size of the product is remarkably increased.

Additionally, since the thermal expansion coefficient of the ceramic wiring board is about 7 mm/m$^2$K, and the thermal expansion coefficient of the piezoelectric single crystal bare chip is about 15 mm/m$^2$K, there is a difference in thermal expansion coefficient between the materials. Thus, when welding the metallic lid or when wire-bonding or flip-chip bonding the input and output electrodes of the device to the via-holes of the wiring board, thermal impact applied from the outside frequently causes damage, such as separation of the bump ball or a bonding surface between the device and the board.

SUMMARY OF THE INVENTION

The present invention has been made to solve the above problems, and it is an object of the present invention to provide a stack type surface acoustic wave package, which can prevent deformation due to thermal impact from the outside during a packaging process to enhance reliability of a product, and a method for manufacturing the same.

It is another object of the present invention to provide a stack type surface acoustic wave package, which can minimize the product according to a tendency of miniaturization of the product, and can reduce the number of components and material costs to reduce manufacturing costs, and a method for manufacturing the same.

In accordance with one aspect of the present invention, the above and other objects can be accomplished by the provision of a stack type surface acoustic wave package, comprising: a first bare chip having a plurality of electrodes formed thereon; a second bare chip having a plurality of electrodes and via-holes formed thereon; a connecting portion electrically connecting the first bare chip to an upper surface of the second bare chip such that the electrodes of the first bare chip face the electrodes of the second bare chip; and a sealing member provided on the first and second bare chips to form an air-tight space on an operating surface between the first and second bare chips.

Preferably, the first and second bare chips are piezoelectric single crystal elements, and the plurality of electrodes of the first and second bare chips comprise an input electrode, an output electrode, and IDT electrodes formed on upper surfaces of the piezoelectric elements facing each other, the IDT electrodes formed on the upper surface of the first bare chip being different in length, width, and gap between the IDT electrodes from those of the IDT electrodes formed on the upper surface of the second bare chip.

Preferably, the connecting portion is a metallic bonding agent interposed between a conductive pad laid on the input and output electrodes of the first bare chip and a conductive pattern electrically connected to the via-holes of the second bare chip.

Preferably, the connecting portion is a metallic bonding agent interposed between a conductive pad laid on the input and output electrodes of the first bare chip and another conductive pad laid on the via-holes of the second bare chip.

More preferably, the metallic bonding agent comprises an Au-based stud bump used for supersonic bonding.

More preferably, the metallic bonding agent comprises an AuSn-based solder bump used for thermal bonding.

Preferably, the sealing member comprises a resin film laminated from an upper surface of the first bare chip to surround side and upper surfaces of the second bare chip, and a metal layer coated to surround the upper surface of the second bare chip, and side and upper surfaces of the resin film.

Preferably, the sealing member comprises a continuous metal dam interposed between a lower surface of the first bare chip and an upper surface of the second bare chip, and a metal layer extending from the metal dam to surround side and upper surfaces of the metal dam.

Preferably, the sealing member is electrically connected to an inner ground terminal to prevent electromagnetic wave from being induced into the package from the outside.

In accordance with another aspect of the present invention, a method for manufacturing a stack type surface acoustic wave package is provided, comprising the steps of: a) preparing a lower wafer having input, output and IDT electrodes formed on an upper surface thereof, and a plurality of via-holes passing through the lower wafer; b) bonding first bare chips, each having input, output and IDT electrodes formed thereon, to the lower wafer via a metallic bonding agent; c) laminating a resin film on the lower wafer to cover side and upper surfaces of the first bare chips; d) removing the resin film to a predetermined depth along a boundary between the first bare chips to form separating grooves therebetween; e) plating a metal layer of a predetermined thickness on the resin film and the separating grooves; and f) cutting a central portion between the separating grooves plated with the metal layer.

Preferably, the step a) comprises printing a conductive pattern on upper ends of the via-holes to be electrically connected to the input and output electrodes, and another conductive pattern on lower ends of the via-holes to be electrically connected to a main board.

Preferably, the step b) comprises flip-chip bonding of the first bare chips to the lower wafer via the metallic bonding agent such that the input and output electrodes, and the IDT electrodes of each first bare chip face the input and output electrodes, and the IDT electrodes of the lower wafer, respectively.

More preferably, flip-chip bonding of the first bare chips to the lower wafer comprises supersonic bonding by use of stud bumps interposed between a conductive pad laid on the input and output electrodes of each first bare chip and a conductive pattern of the input and output electrodes of the lower wafer.

More preferably, flip-chip bonding of the first bare chips to the lower wafer comprises thermal bonding by use of AuSn-based solder bumps interposed between a conductive pad laid on the input and output electrodes of each first bare chip and a conductive pattern of the input and output electrodes of the lower wafer.

Preferably, the step c) comprises laminating the resin film formed of a thermosetting material by thermal compression.

More preferably, the thermosetting resin film is one selected from a polyimide based film and an epoxy-based film.

Preferably, at the step d), the separating grooves are formed to an extent that the upper surface of the lower wafer is exposed to the outside.

Preferably, at the step e), the metal layer is electrically connected to an inner ground terminal to prevent electromagnetic waves from being induced from the outside.

Preferably, at the step e), the metal layer is plated by an electroplating process.

In accordance with yet another aspect of the present invention, a method for manufacturing a stack type surface acoustic wave package is provided, comprising the steps of: a) preparing a lower wafer having input, output and IDT electrodes formed on an upper surface thereof, and a plurality of via-holes passing through the lower wafer; b) forming a metal dam to surround the input, output and IDT electrodes of the lower wafer; c) bonding an upper wafer having input, output and IDT electrodes formed thereon onto the lower wafer via a metallic bonding agent; d) forming separating grooves spaced a predetermined from each other and having a predetermined depth on the upper wafer; e) plating a metal layer of a predetermined thickness from the upper surface of the metal dam to cover the upper wafer; and f) dicing a central portion between the separating grooves plated with the metal layer.

Preferably, the step a) comprises printing a conductive pattern on upper ends of the via-holes to be electrically connected to the input and output electrodes, and another conductive pattern on lower ends of the via-holes to be electrically connected to a main board.

Preferably, the step b) comprises forming the metallic bonding agent while forming the metal dam on the lower wafer.

Preferably, at the step b), the metal layer is electrically connected to an inner ground terminal to prevent electromagnetic waves from being induced from the outside after plating the metal layer.

Preferably, the step c) comprises flip-chip bonding the upper wafer to the lower wafer via the metallic bonding agent such that the input and output electrodes, and the IDT electrodes of the upper wafer face the input and output electrodes, and the IDT electrodes of the lower wafer, respectively.

More preferably, flip-chip bonding of the upper wafer to the lower wafer comprises supersonic bonding by use of stud bumps interposed between a conductive pad laid on the input and output electrodes of the upper wafer and another conductive pad laid on the input and output electrodes of the lower wafer.

More preferably, flip-chip bonding of the upper wafer to the lower wafer comprises thermal bonding by use of AuSn-based solder bumps interposed between a conductive pad laid on the input and output electrodes of the upper wafer and another conductive pad laid on the input and output electrodes of the lower wafer.

Preferably, at the step d), the separating grooves are formed to an extent that the upper surface of the lower wafer is exposed to the outside.

Preferably, at the step e), the metal layer is plated by an electroplating process.

BRIEF DESCRIPTION OF THE DRAWINGS

The above and other objects, features and other advantages of the present invention will be more clearly understood from the following detailed description taken in conjunction with the accompanying drawings:

FIGS. 2a to 2c are views illustrating conventional surface acoustic wave packages, in which

DESCRIPTION OF THE PREFERRED EMBODIMENTS

Preferred embodiments will now be described in detail with reference to the accompanying drawings.

Figure 3:
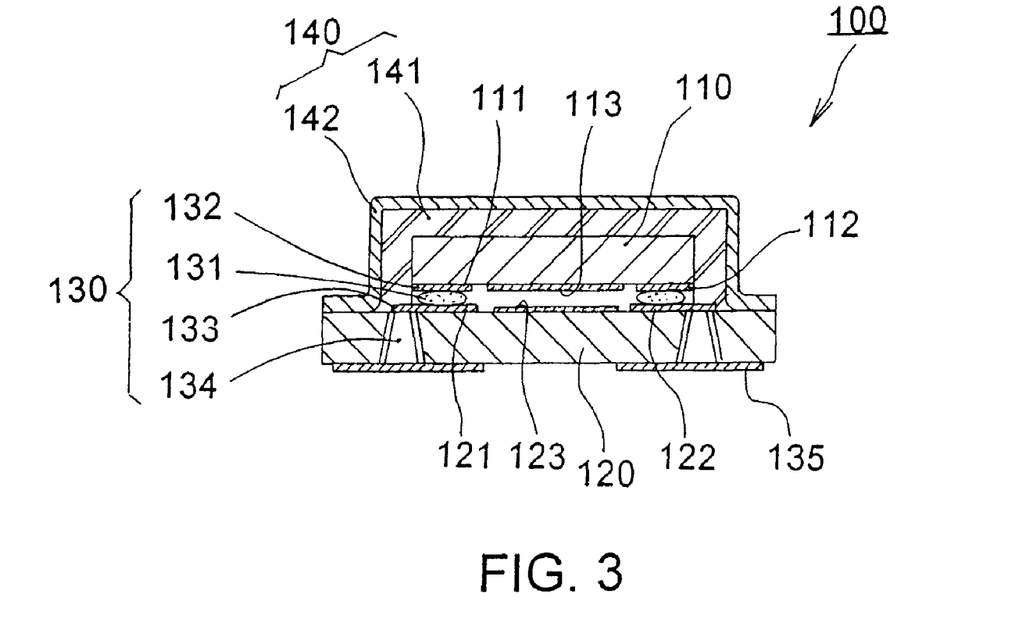
FIG. 3 is a cross-sectional view illustrating a stack type surface acoustic wave package in accordance with a first embodiment of the present invention.
Figure 4:
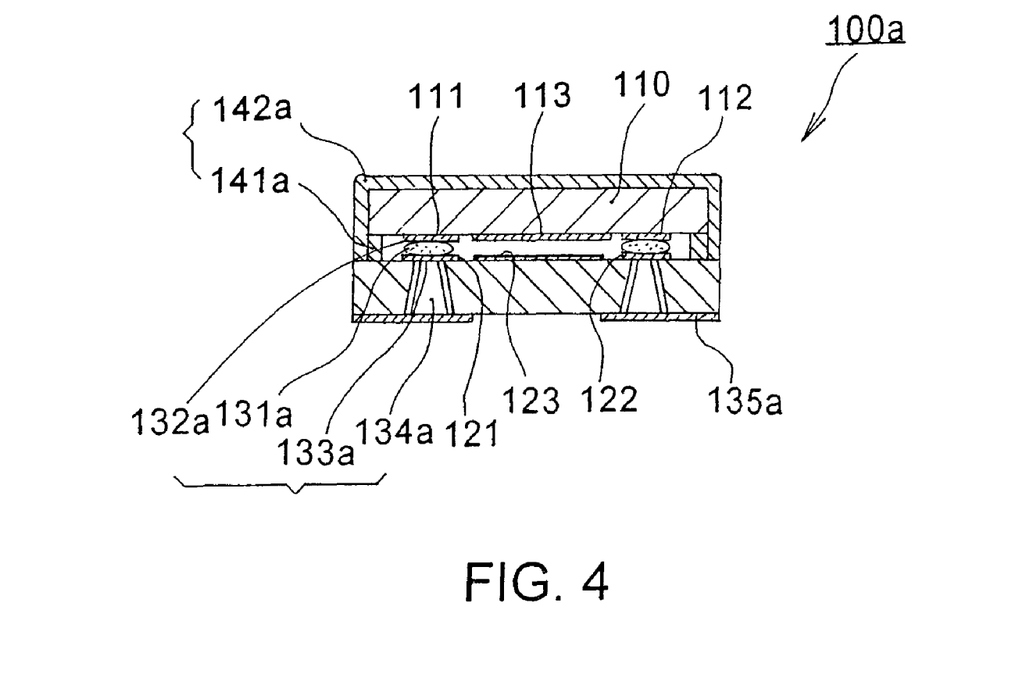
FIG. 4 is a cross-sectional view illustrating a stack type surface acoustic wave package in accordance with a second embodiment of the present invention.

FIGS. 3 and 4 are cross-sectional views illustrating stack type surface acoustic wave packages in accordance with first and second embodiments of the present invention, respectively. As shown in FIGS. 3 and 4, the surface acoustic wave package 100 or 100a of the present invention comprises first and second bare chips 110 and 120, a connecting portion connecting the first and second bare chips 110 and 120, and a sealing member 140 to protect these components from the external environment.

The first bare chip 110 is a piezoelectric single crystal device which has an input electrode 111, an output electrode 112, and IDT electrodes 113 formed on an upper surface thereof, and the second bare chip 120 is another piezoelectric single crystal device which has an input electrode 121, an output electrode 122, and other IDT electrodes 123 formed on an upper surface thereof facing the upper surface of the first bare chip 110.

Here, the IDT electrodes 113 of the first bare chip 110, and the IDT electrodes 123 of the second bare chip 120 are electrodes having different widths, lengths, and gap between the electrodes to filter out different frequency bands.

A plurality of via-holes 134 are formed in the second bare chip 120, and are printed at lower ends thereof with a conductive pattern 135 which will be electrically connected to a main board (not shown).

The connecting portion 130 is interposed between the input and output electrodes 111 and 112 of the first bare chip 110 and the input and output electrodes 121 and 122 of the second bare chip 120 such that the first, second, and IDT electrodes 111, 112 and 113 of the first bare chip 110 face the first, second, and IDT electrodes 121, 122 and 123 of the second bare chip 120. The connecting portion 130 electrically connects these components to each other.

In FIG. 3, the connecting portion 130 can be a metallic bonding agent 131 interposed between a conductive pad 132 laid on the input and output electrodes 111 and 113 of the first bare chip 110 and a conductive pattern 133 electrically connected to upper ends of the via-holes 134 of the second bare chip 120.

Alternatively, in FIG. 4, the connecting portion 130 can be a metallic bonding agent 131a interposed between a conductive pad 132a laid on the input and output electrodes 111a and 113a of the first bare chip 110 and another conductive pad 133a laid on upper ends of the via-holes 134a of the second bare chip 120.

Here, the metallic bonding agent 131 or 131a comprises an Au-based stud bump used for supersonic bonding or an AuSn-based solder bump used for thermal bonding to electrically connect the electrodes to each other while bonding the first and second bare chips 110 and 120 to each other.

The sealing member 140 forms an air-tight space on an operating surface between the first and second bare chips 110 and 120 to protect the first and second bare chips 110 and 120 from the external environment.

In FIG. 3, the sealing member 140 comprises a thermosetting resin film 141 laminated from an upper surface of the first bare chip 110 to surround side and upper surfaces of the second bare chip 120, and a metal layer 142 coated to surround the upper surface of the second bare chip 141, and side and upper surfaces of the resin film 141.

Alternatively, in FIG. 4, the sealing member 140 comprises a continuous metal dam 141a laminated between a lower surface of the first bare chip 110 and an upper surface of the second bare chip 120 to surround the electrodes of the second bare chip 120, and a metal layer 142a extending from the metal dam 141a to surround side and upper surfaces of the metal dam 141a.

Preferably, the metal layer 142 and the metal dam 141a of the sealing member 140 are connected to a ground terminal (not shown) to prevent electromagnetic waves from being induced into the package from the outside.

FIGS. 5a to 5f are step diagrams illustrating a method for manufacturing a stack type surface acoustic wave package according to the first embodiment of the invention.

The surface acoustic wave package 100 of the present invention is a chip-scale type package manufactured via steps a to f described below.

Figure 5:
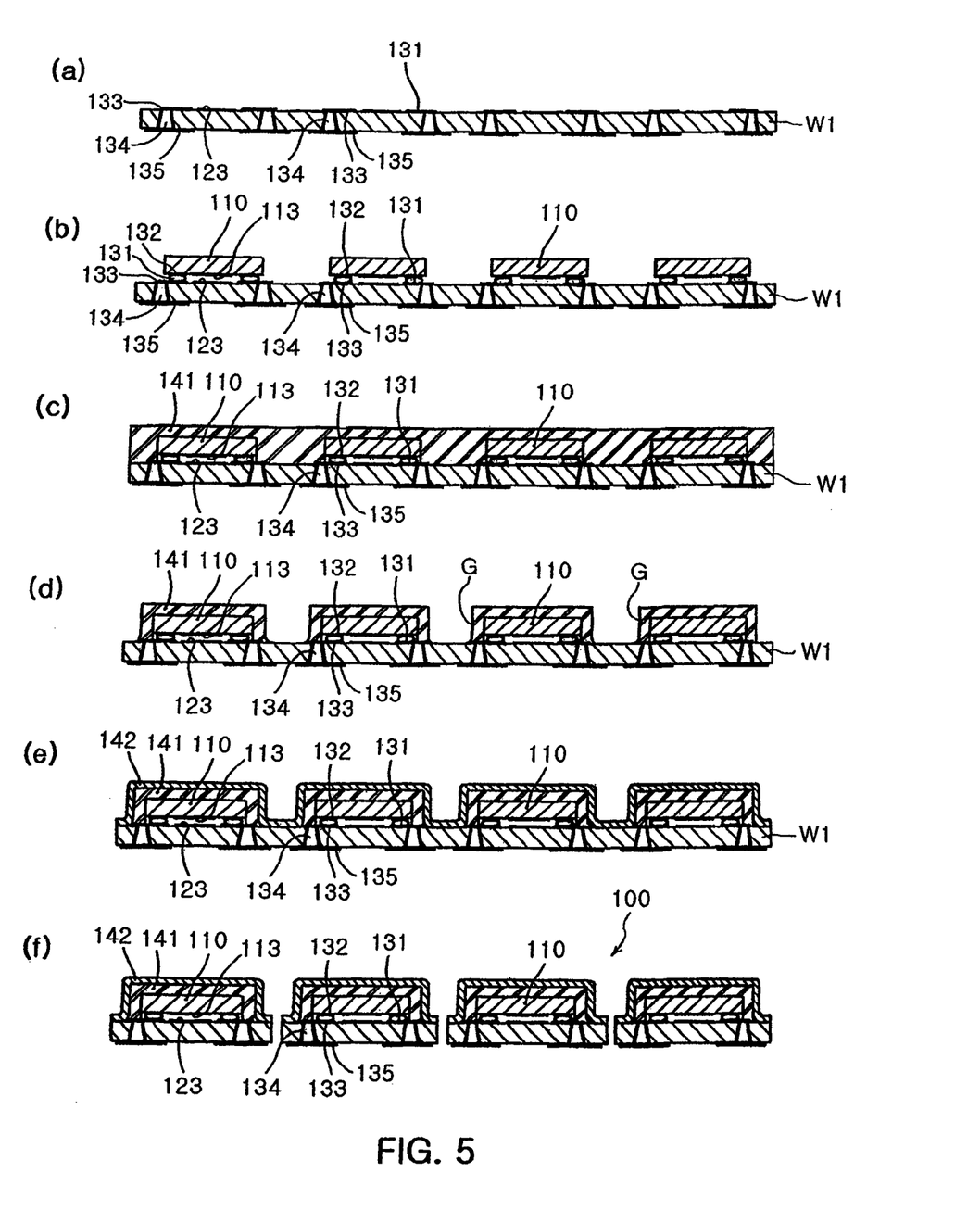
FIGS. 5a to 5f are step diagrams illustrating a method for manufacturing the stack type surface acoustic wave package in accordance with the first embodiment of the present invention.

Step a: Preparing a lower wafer having input, output and IDT electrodes formed on an upper surface thereof, and a plurality of via-holes passing therethrough.

As shown in FIG. 5a, patterns of input, output, and IDT electrodes 121, 122 and 123 are printed on an upper surface of a lower wafer W1 formed of a piezoelectric single crystal.

Then, a plurality of via-holes 134 are formed through the lower wafer W1 having the electrodes 121, 122 and 123 formed thereon by a micromachining process. Upper and lower ends of the via-holes 134 are printed with a conductive pattern 133 electrically connected to the input and output electrodes 121 and 122, and with another conductive pattern 135 electrically connected to a main substrate.

As a result, a plurality of second bare chips 120 are continuously disposed, and separated a predetermined distance from each other on the lower wafer W1 to form a single chip when being cut.

Step b: Bonding first bare chips having input, output and IDT electrodes formed thereon onto the lower wafer via a metallic bonding agent.

As shown in FIG. 5b, after forming the electrodes 121, 122 and 123, and the via-holes 134 on the lower wafer W1, first bare chips 110 having other input, output and IDT electrodes 111, 112 and 113 formed on an upper surface thereof are disposed on the lower wafer W1 such that the electrodes of each first bare chip 110 face the electrodes of the lower wafer W1, respectively.

In this state, a metallic bonding agent 131 is interposed between a conductive pad 132 laid on the input and output electrodes 111 and 113 of each first bare chip 110 and the conductive pattern 133 electrically connected to the input and output electrodes 121 and 122 of the lower wafer W1 to integrally bond the first bare chips 110 and the lower wafer W1 while electrically connecting them.

At this time, flip chip bonding of the first bare chips 110 to the lower wafer W1 via the metallic bonding agent 131 is performed through a supersonic bonding process using Au-based stud bumps as the metallic bonding agent 131 interposed between the conductive pad 132 laid on the input and output electrodes 111 and 112 of each first bare chip 110 and the conductive pattern 133 of the input and output electrodes 121 and 122 of the lower wafer W1.

Alternatively, flip-chip bonding of the first bare chip to the lower wafer may be performed by a thermal bonding process using AuSn-based solder bumps as the metallic bonding agent 131.

At this time, when the stud bumps are used as the metallic bonding agent 131, a bonding temperature of 120 to 180° C. can enhance bonding force of the bump balls.

Step c: Laminating a resin film on the lower wafer to cover side and upper surfaces of the first bare chip.

As shown in FIG. 5c, a thermosetting resin film is laminated on the lower wafer W1 through thermal compression to cover side and upper surfaces of the first bare chip 110 mounted on the lower wafer W1.

At this time, preferably, the thermosetting resin film 141 is one selected from a polyimide based film and an epoxy-based film. The resin film 141 is provided to form an air-tight space on an operating surface of the surface acoustic wave device via control of fluidity through temperature control between the electrode surfaces of the first bare chip 110 and the electrode surfaces of the lower wafer W1.

When laminating the resin film 141, major factors for the laminating step include compressing material, temperature, time, vacuum level, and the like. More specifically, when using the polyimide based film as the thermosetting resin film 141, optimal laminating results can be obtained under the conditions of the laminating process wherein the compressing material has an elasticity in the range of 0.2~1 MPa, the laminating temperature is in the range of 170~200° C., the laminating time is in the range of 30 seconds to 2 minutes, and the vacuum level is in the range of 0.5~1.5 hpa.

Step d: Removing the Rrsin film to a predetermined depth along a boundary between the first bare chips to form separating grooves therebetween.

As shown in FIG. 5d, separating grooves G are formed between the first bare chips 110 separated a predetermined distance from each other on the lower wafer W1 by grooving the laminated resin film 141 to a predetermined depth along a boundary at the center between the first bare chip 110 and another adjacent first bare chip 110.

At this time, the separating grooves G are preferably formed to an extent that the upper surface of the lower wafer W1 is exposed to the outside. With this structure, it is possible to obtain a stable structure in which a metal layer entirely surrounds an upper surface of the package without exposing the resin film 141 on a cut surface during a dicing step after the metal layer is plated on the upper surface of the lower wafer W1 exposed through the bottom of the separating grooves G.

Step e: Plating a metal layer of a predetermined depth on the resin film and the separating groove.

As shown in FIG. 5e, a metal layer 142 having a predetermined thickness is plated on the resin film 141 having the separating grooves G, and on the upper surface of the lower wafer W1 exposed through the separating grooves G in order to prevent infiltration of moisture. In this case, the metal layer 142 is naturally brought into integral contact with the resin film 141 and the piezoelectric single crystal of the lower wafer W1 exposed through the separating grooves G, completely preventing the moisture from infiltrating into the air-tight space between the first bare chip 110 and the lower wafer W1.

Additionally, preferably, the metal layer 142 plated on the resin film 141 is electrically connected to a ground terminal to prevent electromagnetic wave from being induced from the outside.

Plating of the metal layer 142 is preferably performed by electroplating after forming a seed metal with a sputter.

Step f: Dicing a central portion of the separating grooves plated with the metal layer.

As shown in FIG. 5f, after plating the metal layer, the lower wafer W1 is cut by dicing the central portion of the bottom of the separating grooves G in a direction perpendicular to the upper surface of the lower wafer W1. As a result, as shown in FIG. 7, a plurality of stack type surface acoustic wave packages 100 can be manufactured simultaneously, each of which has a stacked structure having the first bare chip 110 flip-chip bonded on the upper surface of the second bare chip 120, and has the resin film 141 and the metal layer 142 to protect the first and second bare chips 110 and 120, and the electrode operating surfaces therebetween from the external environment.

A dicing width of the lower wafer W1 is preferably smaller than the width between the separating grooves G.

FIGS. 6a to 6f are step diagrams illustrating a method for manufacturing a stack type surface acoustic wave package according to a second embodiment of the invention.

A surface acoustic wave package 10a of the present invention is manufactured via steps a to f described below.

Figure 6:
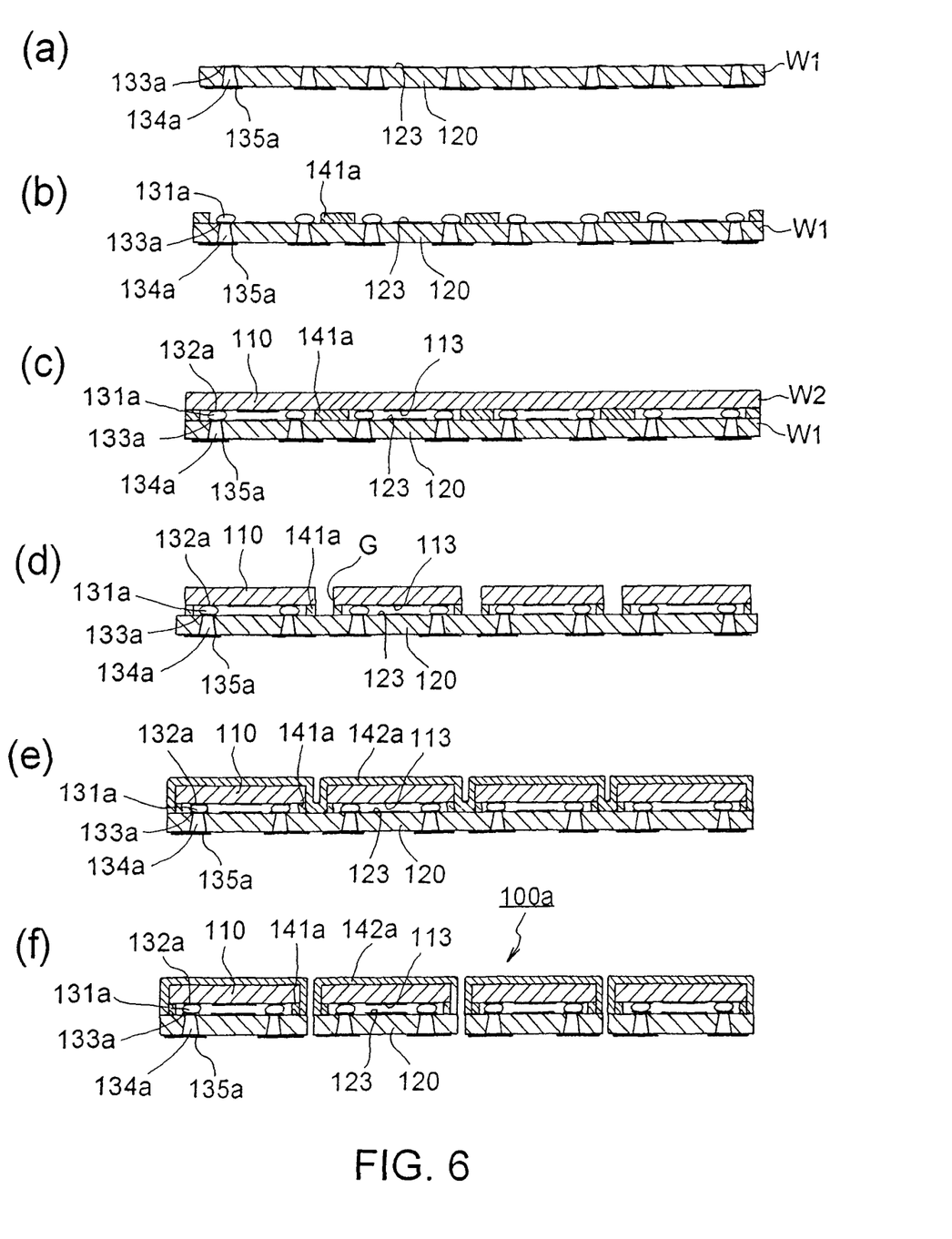
FIGS. 6a to 6f are step diagrams illustrating a method for manufacturing the stack type surface acoustic wave package in accordance with the second embodiment of the present invention.

Step a: Preparing a lower wafer having input, output and IDT electrodes formed on an upper surface thereof, and a plurality of via-holes passing therethrough.

As shown in FIG. 6a, patterns of input, output, and IDT electrodes 121, 122 and 123 are printed on an upper surface of a lower wafer W1 formed of a piezoelectric single crystal.

Then, a plurality of via-holes 134 are formed through the lower wafer W1 having the electrodes 121, 122 and 123 formed thereon by a micromachining process. Upper and lower ends of the via-holes 134 are printed with a conductive pad 133a electrically connected to the input and output electrodes 121 and 122, and with another conductive pattern 135a electrically connected to a main substrate.

As a result, a plurality of second bare chips 120 are continuously disposed, and separated a predetermined distance from each other on the lower wafer W1 to form a single chip when being cut.

Step b: Forming a metal dam to surround the input, output and IDT electrodes of the lower wafer.

As shown in FIG. 6b, after forming the electrodes 121, 122 and 123, and the via-holes 134 on the lower wafer W1, a continuous loop-shaped wall is formed to form a shielding wall surrounding the input, output and IDT electrodes 121, 122 and 123 formed on the upper surface of the lower wafer W1.

Step c: Bonding an upper wafer having input, output and IDT electrodes formed thereon to the lower wafer via a metallic bonding agent.

As shown in FIG. 6c, an upper wafer W2 having other input, output and IDT electrodes 111, 112 and 113 formed on an upper surface thereof is disposed on the lower wafer W1 such that the electrodes of the upper wafer W2 face the electrodes of the lower wafer W1, respectively.

In this state, a metallic bonding agent 131a is interposed between a conductive pad 132a laid on the input and output electrodes 111 and 113 of the upper wafer W2 and the conductive pad 133a electrically connected to the input and output electrodes 121 and 122 of the lower wafer W1 to integrally bond the upper wafer W2 and the lower wafer W1 while electrically connecting the two.

At this time, the upper wafer W2 and the lower wafer W1 must be accurately aligned to each other in order to ensure that the electrodes of the upper wafer W2 correspond to the electrodes of the lower wafers W1 when they are bonded. In this regard, since the piezoelectric single crystal wafer is substantially transparent, aligning of the upper and lower wafers can be easily performed.

Additionally, the metal dam 141a allows an air-tight space to be formed between the upper and lower wafer W2 and W1 in order to completely shield an electrode operating surface from the external environment.

At this time, flip chip bonding of the upper wafer W2 to the lower wafer W1 via the metallic bonding agent 131 is performed through a supersonic bonding process using Au-based stud bumps as the metallic bonding agent 131 interposed between the conductive pad 132a laid on the input and output electrodes 111 and 112 of the upper wafer W1 and the conductive pad 133a laid on the input and output electrodes 121 and 122 of the lower wafer W1. Alternatively, flip-chip bonding may be performed by a thermal bonding process using AuSn-based solder bumps as the metallic bonding agent 131.

Additionally, the metallic bonding agent 131a may be formed by screen printing, electroless plating or depositing solders on the lower wafer W1 when forming the metal dam 141a on the lower wafer W1.

At this time, preferably, the metallic bonding agent 131a and the metal dam 141a comprise gold (Au) or Au alloys such as AuSn.

Step d: Forming separating grooves spaced a predetermined from each other and having a predetermined depth on the upper wafer.

As shown in FIG. 6d, separating grooves G having a predetermined depth are formed and separated a predetermined distance from each other on the upper wafer W2 by grooving the upper wafer W2 and the metal dam 141a such that a plurality of first bare chips 110 having input, output and IDT electrodes 111, 112 and 113 formed thereon are uniformly formed on the lower wafer W1.

At this time, the separating grooves G are preferably formed to an extent that the upper surface of the lower wafer W1 is exposed to the outside.

Step e: Plating a metal layer having a predetermined thickness from the upper surface of the metal dam to cover the upper wafer.

As shown in FIG. 6e, after forming the separating grooves G on the upper wafer W2, a metal layer 142a having a predetermined thickness is plated on the upper wafer W2 having the separating grooves G, and on the upper surface of the lower wafer W1 exposed through the separating grooves G in order to prevent infiltration of moisture.

In this case, the metal layer 142a is naturally brought into integral contact with the metal dam 141a exposed through the separating grooves G, completely preventing the moisture from infiltrating into the air-tight space between the first bare chips 110 and the lower wafer W1.

At this time, preferably, after plating the metal layer 142a, the metal dam 141a is electrically connected to a ground terminal to prevent electromagnetic waves from being induced from the outside.

Plating of the metal layer 142a is preferably performed by electroplating after forming a seed metal with a sputter.

Step f: Dicing a central portion between the separating grooves plated with the metal layer.

As shown in FIG. 6f, after plating the metal layer 142a, the lower wafer W1 is cut by dicing the central portion between the separating grooves G in a direction perpendicular to the upper surface of the lower wafer W1. As a result, a plurality of stack type surface acoustic wave packages 100a can be provided simultaneously, each of which has a stacked structure having the first bare chip 110 flip-chip bonded to the upper surface of the second bare chip 120, and has the metal dam 141a and the metal layer 142a to protect the first and second bare chips 110 and 120, and the electrode operating surfaces therebetween from the external environment.

A dicing width of the lower wafer W1 is preferably smaller than the width between the separating grooves G.

As apparent from the above description, since the surface acoustic wave package of the present invention has vertically flip chip bonded first and second bare chips, each having a plurality of electrodes and a sealing member surrounding the first and second bare chips to form an air-tight space on an operating surface between the first and second bare chips, a base of the package can be constituted by a transparent piezoelectric single crystal board instead of a ceramic wiring board, thereby reducing the volume of the board and the chip size, and minimizing the overall package size.

Additionally, according to the invention, since the transparent piezoelectric single crystal board is used, the number of components can be significantly reduced, thereby remarkably reducing material costs.

Additionally, according to the invention, the first and second bare chips, each having IDT electrodes different in width, length, and gap therebetween from others, are vertically laminated, and filter out different frequency bands to realize multiple frequency bands without change in width, so that the overall size of the package can be remarkably reduced in comparison to the conventional package having longitudinally disposed bare chips.

Additionally, according to the invention, since the first and second bare chips are made of the piezoelectric single crystals having the same thermal expansion coefficient, they do not suffer deformation caused by temperature variation such as thermal impact from the outside during flip-chip bonding, so that the first and second bare chips can be stably bonded using metal bumps, and provide a structure having high thermal resistance, thereby enhancing product reliability.

It should be understood that the embodiments and the accompanying drawings have been described for illustrative purposes, and the present invention is limited only by the following claims. Further, those skilled in the art will appreciate that various modifications, additions and substitutions are allowed without departing from the scope and spirit of the invention according to the accompanying claims.

What is claimed is:

1. A method for manufacturing a stack type surface acoustic wave package, comprising the steps of:
    a) preparing a lower wafer having input, output and IDT electrodes formed on an upper surface thereof, and a plurality of via-holes passing through the lower wafer;
    b) forming a metal dam to surround the input, output and IDT electrodes of the lower wafer;
    c) bonding an upper wafer having input, output and IDT electrodes formed thereon onto the lower wafer via a metallic bonding agent;
    d) forming separating grooves spaced a predetermined from each other and having a predetermined depth on the upper wafer;
    e) plating a metal layer of a predetermined thickness from the upper surface of the metal dam to cover the upper wafer; and
    f) dicing a central portion between the separating grooves plated with the metal layer.

2. The method according to claim 1, wherein the step a) comprises printing a conductive pattern on upper ends of the via-holes to be electrically connected to the input and output electrodes, and another conductive pattern on lower ends of the via-holes to be electrically connected to a main board.

3. The method according to claim 1, wherein the step b) comprises forming the metallic bonding agent while forming the metal dam on the lower wafer.

4. The method according to claim 1, wherein at the step b), the metal layer is electrically connected to an inner ground terminal to prevent electromagnetic waves from being induced from the outside after plating the metal layer.

5. The method according to claim 1, wherein the step c) comprises flip-chip bonding of the upper wafer to the lower wafer via the metallic bonding agent such that the input and output electrodes, and the IDT electrodes of the upper wafer face the input and output electrodes, and the IDT electrodes of the lower wafer, respectively.

6. The method according to claim 5, wherein flip-chip bonding of the upper wafer to the lower wafer comprises supersonic bonding by use of stud bumps interposed between a conductive pad laid on the input and output electrodes of the upper wafer and another conductive pad laid on the input and output electrodes of the lower wafer.

7. The method according to claim 5, wherein flip-chip bonding of the upper wafer to the lower wafer comprises thermal bonding by use of AuSn-based solder bumps interposed between a conductive pad laid on the input and output electrodes of the upper wafer and another conductive pad laid on the input and output electrodes of the lower wafer.

8. The method according to claim 1, wherein at the step d), the separating grooves are formed to an extent that the upper surface of the lower wafer is exposed to the outside.

9. The method according to claim 1, wherein, at the step e), the metal layer is plated by an electroplating process.

* * * * *